(12) United States Patent
Yin et al.

(10) Patent No.: US 12,712,019 B2
(45) Date of Patent: Aug. 18, 2026

(54) PHOTONIC CONTENT ADDRESSABLE MEMORY

(71) Applicant: Wisconsin Alumni Research Foundation, Madison, WI (US)

(72) Inventors: Zihan Yin, Madison, WI (US); Akhilesh Jaiswal, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 107 days.

(21) Appl. No.: 18/786,879

(22) Filed: Jul. 29, 2024

(65) Prior Publication Data

US 2026/0031144 A1 Jan. 29, 2026

(51) Int. Cl.
*G11C 11/04* (2006.01)
*G11C 13/00* (2006.01)
*G11C 13/04* (2006.01)

(52) U.S. Cl.
CPC ........ *G11C 13/047* (2013.01); *G11C 13/0061* (2013.01)

(58) Field of Classification Search
CPC .......................... G11C 13/047; G11C 13/0061
See application file for complete search history.

(56) References Cited

U.S. PATENT DOCUMENTS 5,095,200 A 3/1992 Matsuda et al.
7,787,719 B1 8/2010 Vawter
8,582,931 B1 * 11/2013 Vawter .................. G02F 1/3133 385/24
11,057,143 B1 7/2021 Van Vaerenbergh et al.
2010/0182665 A1 7/2010 Covey
2020/0258587 A1 8/2020 Li et al.

OTHER PUBLICATIONS

International Search Report for PCT/US2025/038407 filed on Jul. 21, 2025.
Ramesh Kudalippalliyalil et al.; "Towards scalable, energy-efficient and ultra-fast optical sram." arXiv preprint arXiv:2111.13682 (2021) pp. 1-5. US.
Carlos Rios et al.; "In-memory computing on a photonic platform." Science advances 5, No. 2; pp. 1-9; (2019): eaau5759. US.
Carlos Rios et al.; "Integrated all-photonic non-volatile multi-level memory." Nature Photonics 9, No. 11; pp. 725-732 (Nov. 2015).
Apostolos Tsakyridis et al.; "10 Gb/s optical random access memory (RAM) cell." Optics letters 44, No. 7 (2019): pp. 1821-1824. US.
Nikos Pleros et al.; "Optical static RAM cell." IEEE Photonics Technology Letters 21, No. 2 (2008): pp. 73-75.

* cited by examiner

*Primary Examiner* — Xiaochun L Chen
(74) *Attorney, Agent, or Firm* — Boyle Fredrickson, S.C.

(57) ABSTRACT

A photonic content addressable memory employs cross coupled optical inverters to provide a bistable element that can be set or reset and interrogated optically. Optical switches controlled by the state of the bistable element can compare that state to optically conveyed pattern bits providing a "wired OR" on an output line quickly indicating matching along a logical row of data so stored. The bistable element can be simultaneously interrogated with different search patterns using parallel banks of optical switches tuned to different frequencies.

11 Claims, 3 Drawing Sheets

70
D1
R7

70
D1
R7

PHOTONIC CONTENT ADDRESSABLE MEMORY

CROSS REFERENCE TO RELATED APPLICATION

The present invention relates to content addressable memories and, in particular, to a high-speed, content addressable memory that may be interrogated using a light signal to provide light signal outputs.

BACKGROUND OF THE INVENTION

Content Addressable Memories (CAMs), also known as associative memories, are a specialized type of computer memory used in high-speed searching applications. In a conventional computer memory, the memory receives an address as an input and provides data stored at the location indicated by that address. In contrast, a CAM receives an input designating stored data, and compares that input against a table of stored data to return the address of matching data.

CAM is widely used in networking applications, especially in routers and switches to route data. For example, when a packet arrives, a router can use a CAM to quickly check whether the destination IP address of the packet is in the CAM and if so identify the appropriate outgoing interface that may be linked to the IP address of the returned CAM address.

SUMMARY OF THE INVENTION

The present invention provides a photonic CAM providing an advantage over conventional CAMs in its ability to receive photonic or light input data and provide photonic or light output with reduced transmission delays and high throughput. The CAM may accommodate parallel operations through the use of multiple light frequencies.

In one embodiment, the invention provides an optical CAM having a set of memory cells each providing a first and a second optical switch with an input and output. The output of the first optical switch is connected to the input of the second optical switch and the output of the second optical switch is connected to the input of the first optical switch, each optical switch operating as an inverter to produce a bistable element. A third and fourth optical switch are also provided each receiving an input determined by the output of the first and second optical switches, respectively. A first and second content input line provides independent optical signals to the third and fourth optical switches, respectively, denoting a search pattern, and a content output line receives an optical signal from both of the third and fourth optical switches to provide a logical OR of those optical signals.

It is thus a feature of at least one embodiment of the invention to provide a simple architecture for a photonic CAM formed of cross-coupled optical inverters creating a bistable storage element.

The CAM may further including a fifth and sixth optical switch each receiving an input determined by an output of the first and second optical switches, respectively, and a memory cell read line providing an optical signal to both of the fifth and sixth optical switches. A first and second memory cell output line receives an optical signal from the fifth and sixth optical switches, respectively, to provide respective complementary outputs indicating a state of the bistable element.

It is thus a feature of at least one embodiment of the invention to provide a CAM with optical readout.

Alternatively or in addition, the CAM may include a seventh and eighth optical switch each providing a respective output to the inputs of the first and second optical switches and a memory cell write line providing an optical signal to both of the seventh and eighth optical switches. A first and second memory cell input line provides respective and mutually complementary optical signals to the inputs of the first and second optical switches to override their states.

It is thus a feature of at least one embodiment of the invention to provide a CAM with optical input.

The seventh and eighth optical switches may operate at a first frequency different from a second frequency required for operation of the first and second optical switches.

It is thus a feature of at least one embodiment of the invention to implement a shared optical read and write line by employing different read and write frequencies.

The first and second optical switches may be hybrid electrical photonic devices, for example, a photodetector, providing an optical input and producing electrical output to control a microring optical resonator providing a switched output.

It is thus a feature of at least one embodiment of the invention to provide a bistable element amenable to large-scale manufacturing using well understood techniques.

The third and fourth optical switches may provide an optical output as switched by a microring optical resonator receiving a tuning voltage from a photodetector and may further include a semiconductor amplifier positioned between the photodetector and the microring optical resonator.

It is thus a feature of at least one embodiment of the invention to minimize capacitive delays to this use of short conductors and buffer amplifiers on the electrical components of the CAM.

The CAM may further provide multiple third optical switches each receiving an input determined by the output of the first optical switch and multiple fourth optical switches each receiving an input determined by the output of the second optical switch. Each pair of a single third optical switch and single fourth optical switch may receive first and second content input lines providing independent optical signals to different pairs denoting different search patterns. An independent content output line for each pair may receive an optical signal from both of the third and fourth optical switches of the pair to provide a logical OR of those optical signals. The optical switches of each pair may operate at different frequencies from the operating frequencies of other pairs.

It is thus a feature of at least one embodiment of the invention to allow parallel interrogations of the CAM with different search patterns at the same time by using frequency multiplexing.

The CAM may further include a frequency multiplexer receiving different search patterns to encode them in different frequencies to be simultaneously applied to the first and second content input lines allowing parallel interrogation of the bistable element according to different patterns.

It is thus a feature of at least one embodiment of the invention to preprocess the input signals for frequency multiplexing.

These particular objects and advantages may apply to only some embodiments falling within the claims and thus do not define the scope of the invention.

DETAILED DESCRIPTION OF THE PREFERRED EMBODIMENT

Figure 1:
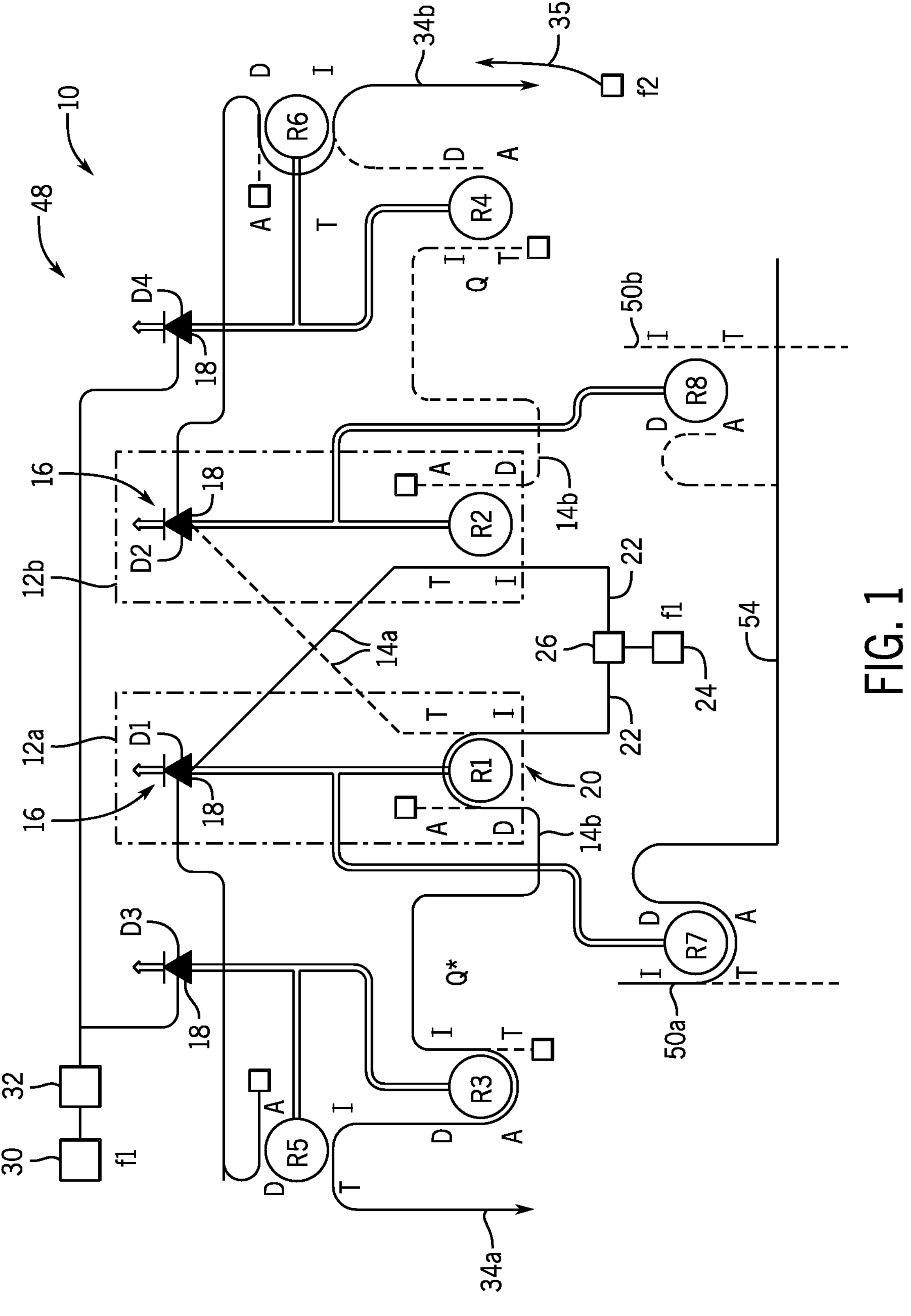
FIG. 1 is a schematic diagram of a memory cell forming a part of a content addressable memory having multiple such memory cells arranged in logical rows and columns.

Referring now to FIG. 1, a memory cell 10 useful for the construction of a content addressable memory may provide for first and second photonic inverters 12*a* and 12*b*. Each photonic inverter 12 provides two complementary output lines 14*a* and 14*b* which provide output light signals. These signals on the output lines 14*a* and 14*b* may be either high or low (zero) intensity mapping to a logical true or false and will be logically complementary. The output light signals for each photonic inverter 12 are logically determined by the input 16 of the photonic inverter 12.

In one embodiment, the input 16 may be provided by a photodiode or other electrical photodetector 18 producing an electrical signal based on its illumination. In the case where the photodetector 18 is a photodiode, the cathode of the photodiode may be electrically biased to provide an electrical current upon the receipt of light. Generally the photosensors 18 are broadband to respond to all of the different light signals discussed below.

For clarity of description, each of the photosensors 18 will be henceforth designated with a letter number combination D1-D4.

In this embodiment, an electrical signal provided by each photodetector 18 of each photonic inverter 12 is used to control a four-port microring resonator (MMR) 20 so as to switch light received at the I port to be conducted either to the T port, in the absence of an electrical signal from the photodetector 18, or to output to the D port in the presence of an electrical signal from the photodetector 18 thus implementing an optical switching. Generally the designation of these terminals is relative to an arbitrarily selected I terminal being the terminal at which light is introduced. Light received at the I terminal is routed either to the T or D terminals depending on the state of the MMR as activated by a photodetector 18.

Henceforth, for clarity of description, each of the MMRs 20 will be designated with a letter number combination R1-R10. In FIG. 1, optical waveguides 22 are indicated by a solid line (when conducting light) and a dotted line when not conducting light. Electrical conductors are indicated by a double line. Far ends of the waveguides 22 are terminated with passive light absorbers indicated generally by unlabeled boxes.

Further discussion of the construction of MMRs 20 suitable for use with the present invention can be found at R. Soref and B. Bennett, "Electrooptical effects in silicon," IEEE Journal of Quantum Electronics 23, 123-129 (1987); W. Bogaerts, P. De Heyn, T. Van Vaerenbergh, K. De Vos, S. Kumar Selvaraja, T. Claes, P. Dumon, P. Bienstman, D. Van Thourhout, and R. Bacts, "Silicon microring resonators," Laser & Photonics Reviews 6, 47-73 (2012); G. T. Reed, G. Mashanovich, F. Y. Gardes, and D. Thomson, "Silicon optical modulators," Nature Photonics 4, 518-526 (2010); and Q. Xu, B. Schmidt, S. Pradhan, and M. Lipson, "Micrometre-scale silicon electro-optic modulator," Nature 435, 325-327 (2005), all hereby incorporated by reference.

Referring still to FIG. 1, each of the first and second photonic inverters 12*a* and 12*b* receives laser light through optical waveguides 22 at the I ports of MMRs R1 and R2 respectively.

The laser light may be provided by a solid-state laser 24 separated into separate beams by a beam splitter 26. In one embodiment a laser with a wavelength of 1270 nm is used.

The inverting output of the R1 (through the T port) of inverter 12*a* is connected to the photodetector D2 of inverter 12*b* and, likewise, the inverting output of R2 (through the T port) of the inverter 12*b* is connected to the photodetector D1 of inverter 12*a* in a cross coupling that forms a bistable element. Here the light is depicted as illuminating photodetector D1 and not photodetector D2, but it will be appreciated that the alternative state with light illuminating the photodetector D2 and not the photodetector D1 is equally stable.

A readout of the state of this bistable element is provided by R3 and R4, the former receiving light from the D port of R1 and the latter receiving light from the D port of the R2 (in the depicted state). R3 and R4 are activated, respectively, by diodes D3 and D1 receiving light from a laser 30 and beam splitter 32 providing a memory cell read/write signal. This read/write signal activates R3 and R4 to conduct light (if any) from R1 or R2 to respective complementary readout lines 34*a* and 34*b* indicating the state of the bistable element. Laser 30 may have an arbitrary wavelength within the sensitivity range of the photodetectors 18 and modulation range of rings R1 and R2.

The readout lines 34*a* and 34*b* also serve as write lines. In order to use the readout lines 34*a* and 34 also for writing, readout light transmitted to the readout lines 34*a* and 34*b* is first be received by the respective I ports of R5 and R6. R5 and R6 are tuned to a different frequency than R1 and R2 so as not to serve as optical switches for the light from laser 24 and simply provide a conduit from their I to their T ports in this case of reading.

During a writing operation, the state of R5 and R6 will change. During writing, R5 and R6 which are respectively connected to D3 and D4 are activated with the light from the beam splitter 32 providing a read/write signal. As noted, during writing, the readout lines 34*a* and 34*b* serve as write lines to receive light 35 rather than output light. The received light is at the resonant frequency of R5 and R6 and complementary for each of R5 and R6. In this example, writing light 35 is shown as input on 34*b* and no light signal is input on 34*a*.

Because the light signal input on 34*b* (or 34*a*) has a frequency different from the wavelength of the laser 24, it can be routed or switched by R5 and R6 (in this case R6) which conduct light from the I port of R6 to the D port to illuminate diode D2 forcing a state where light is diverted from diode D1 to diode D2 changing the state of the memory cell 10. After the input light on 34*a* is removed and/or the read/write light from beam splitter 32 ceases, the state is preserved. Thus, the optical and electrical circuitry described above provides an optically readable and writable bistable element 48.

A bistable element according to these teachings is generally described by Ramesh Kudalippalliyalil, Sujith Chandran, Ajey P Jacob, Akhilesh Jaiswal in Towards scalable, energy-efficient, and ultra-fast optical SRAM, published 2021 Nov. 25 as an arXiv preprint arXiv:2111.13682 and hereby incorporated by reference.

Referring still to FIG. 1, this bistable element 48 can be modified to provide a content addressable memory through the addition of R7 and R8 receiving an electrical signal respectively from D1 and D2. This connection allows R7 and R8 to be responsive to the state of the bistable element 48 which may represent one bit in a search word used to designate desired contents of the content addressable memory. In use, R7 and R8 may receive a search bit along optical search line 50. This search bit is one bit in a search word describing the contents of the CAM being sought. A logical true in this example is represented by illumination of optical search line 50*b* and a logical false is represented by illumination of optical search line 50*a*.

If the state of the bistable element 48 is such that D1 is illuminated (as depicted and designated in this example to represent a logical false state), this light from search line 50*a* will be conducted around R7 to exit the D terminal connected to a row match line 54. Thus, illumination of the row match line 54 indicates a lack of matching between the search line 50 and the state of the bistable element 48 indicated by R7. In this case, R8, receiving the optical search line 50*b* but not activated by diode D2, will not conduct the light to the row match line 54 but will serve this purpose if the state of the bistable element 48 is a logical true state (diode D2 illuminated) thus allowing either state of the bistable element to be properly detected.

The wavelength of the light used on the search line 50 may be the same or different from that produced by the lasers 24 and 30 and, of course, will be independently controlled.

Figures 3, 4, 5:
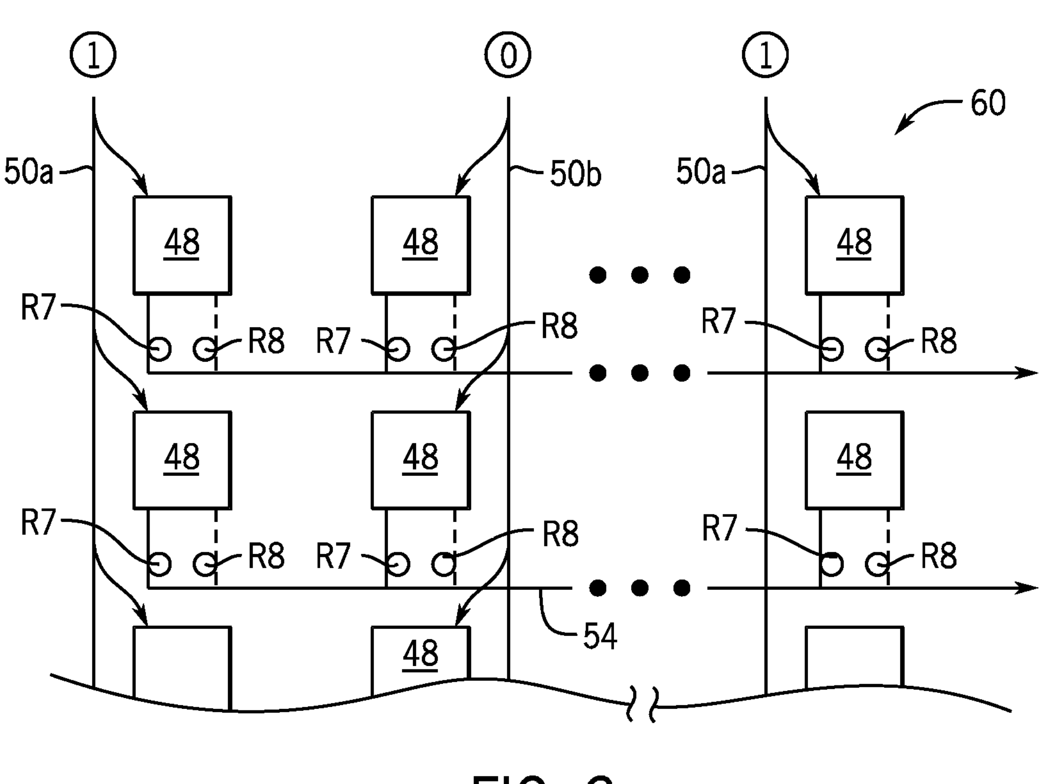
FIG. 3 is a diagram showing interconnection of the memory cells in a two-dimensional array of arbitrary size.
FIG. 4 is a fragmentary detail of the schematic of FIG. 1 showing the introduction of an electrical amplification stage using a bipolar junction transistor.
FIG. 5 is a figure similar to that of FIG. 4 showing the use of a field-effect transistor for electrical amplification.

Referring to FIG. 3, in the formation of a content addressable (CAM) memory 60, multiple bistable elements 48 may be arranged in logical rows and columns. Each column may receive an independent search line 50 representing one bit in a pattern to be identified within a multi bit word of the CAM stored in rows of the bistable elements 48. Each row stores multiple bits of the data element to be matched and may have a shared common match line 54 along the bistable elements 48 of that row providing a "wired OR" of the signals produced by the respective R7 and R8 duplicated for each bistable element 48. The other bistable elements 48 of the row will also share this common match line 54.

It will be appreciated that the match line 54 will be low only if there is a perfect match of all of the bits on the search lines 50 for the given pattern for all of the bistable elements 48 of the row. A simultaneous searching of multiple rows is conducted by the use of a beam splitter to divide each search line 50 for a given column into multiple lines that can be used to drive each of the individual bistable elements 48.

Referring momentarily to FIGS. 4 and 5, the ability of a single diode, for example, diode D1, to rapidly drive R1 and R7 against the capacitance of the electrical connections can be improved by the addition of a solid-state or semiconductor amplifier element 70 along this signal path. In one example of FIG. 4 a base of the bipolar junction transistor may be connected to the photodetector 18 and its emitter connected to the MMR 20. Or, for example, as shown in FIG. 5, a gate of a field-effect transistor or other similar device may be connected to the photodetector 18 and its source connected to the MMR 20. A similar amplifier element 70 would be used for corresponding R8.

Figure 2:
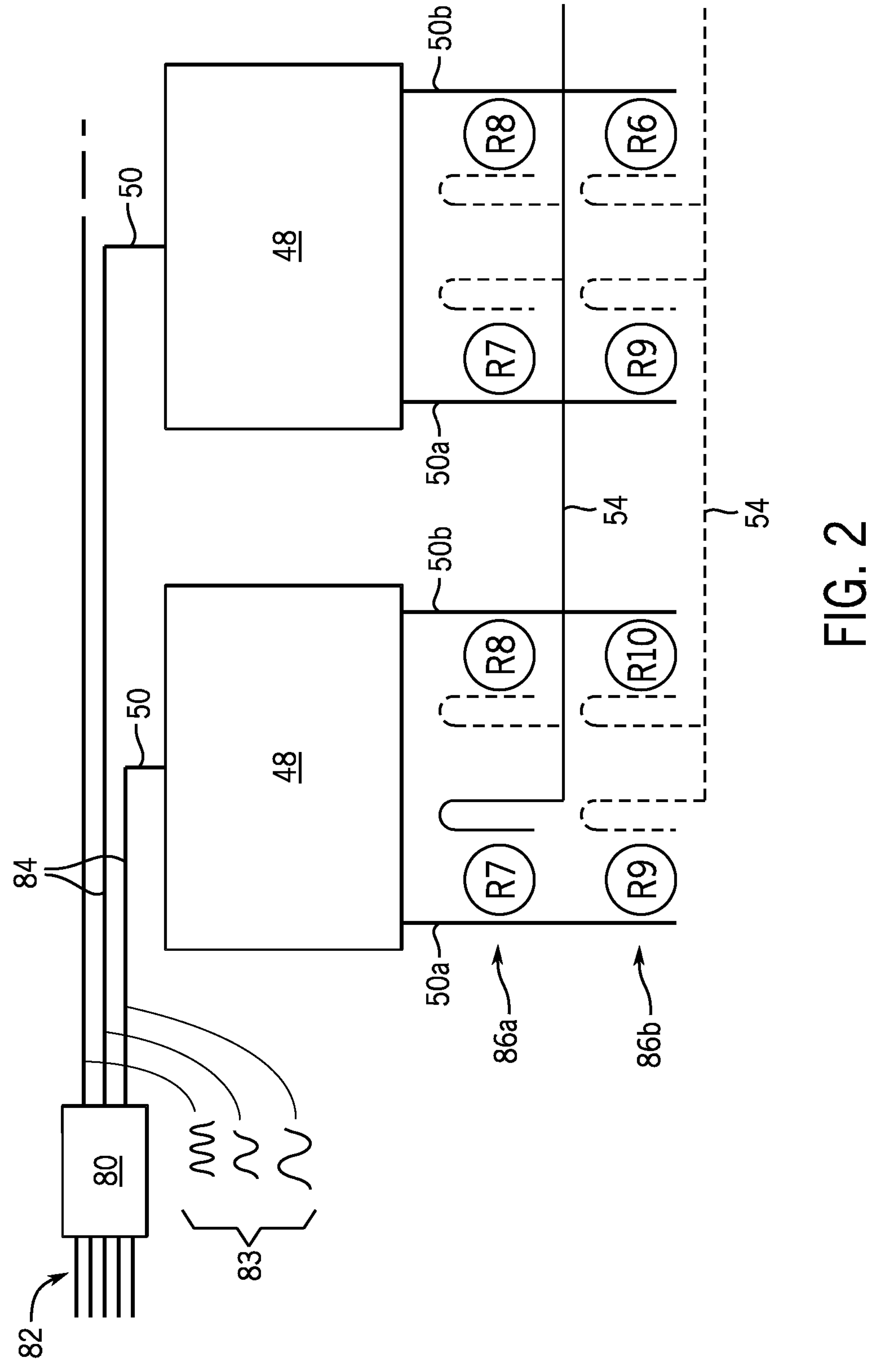
FIG. 2 is a diagram showing use of the memory cell in a frequency multiplexing system for parallel content searching.

Referring now to FIG. 2, the present invention importantly allows the possibility of simultaneous or parallel interrogation of multiple bistable elements 48 in multiple rows with different search patterns. In this case, each different search pattern may be conveyed by a different frequency or wavelength of laser light 83 introduced along search lines 50. A modulator 80 receiving multiple search patterns 82 provides light conduits 84 associated with the search lines 50 of each column. Each search line 50 then carries simultaneously several different wavelengths of light expressing different search patterns invoking MMR resonance in a single pair of MMRs R7 and R8. In this case, for each bistable element 48, the R7 and R8 of FIG. 1 are duplicated in pair 86*a* of R7 and R9 and pair 86*b* of R10 and R11, each having a correspondingly unique match line 54.

Importantly, each of the MMRs of each pair 86 are sensitive in only one of the different frequencies of light 83 output by the modulator 80 to independently check for different patterns in the same bistable elements 48. While a system with two different wavelengths of light is shown, the number of different wavelengths may be arbitrarily increased to the limits of providing suitable band separation for individual activation of different MMRs 20.

The present invention provides a relatively simple architecture that can be fabricated using conventional semiconductor techniques and importantly can operate without more complex structures such as semiconductor optical amplifiers, Mach-Zehnder interferometers, ring lasers, photonic crystal cavities, and optomechanical cavities.

Certain terminology is used herein for purposes of reference only, and thus is not intended to be limiting. For example, terms such as "upper", "lower", "above", and "below" refer to directions in the drawings to which reference is made. Terms such as "front", "back", "rear", "bottom" and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features of the present disclosure and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

It is specifically intended that the present invention not be limited to the embodiments and illustrations contained herein and the claims should be understood to include modified forms of those embodiments including portions of the embodiments and combinations of elements of different embodiments as come within the scope of the following claims. All of the publications described herein, including patents and non-patent publications, are hereby incorporated herein by reference in their entireties To aid the Patent Office and any readers of any patent issued on this application in interpreting the claims appended hereto, applicants wish to note that they do not intend any of the appended claims or claim elements to invoke 35 U.S.C. 112(f) unless the words "means for" or "step for" are explicitly used in the particular claim.

We claim:

1. An optical content addressable memory comprising:

a set of memory cells each providing:

a first and a second optical switch each having an input and output determining a switch state, with the output of the first optical switch connected to the input of the second optical switch and the output of the second optical switch connected to the input of the first optical switch, each optical switch operating as an inverter to produce a bistable element;

a third and fourth optical switch each receiving an input determining a switch state, the input determined by the output of the first and second optical switches respectively;

a first and second content input line providing independent optical signals to the third and fourth optical switches respectively denoting a search pattern; and a content output line receiving an optical signal from both of the third and fourth optical switches to provide a logical OR of those optical signals.

2. The optical content addressable memory of claim 1 further including a fifth and sixth optical switch each receiving an input determined by an output of the first and second optical switches respectively;

a memory cell read line providing an optical signal to both of the fifth and sixth optical switches; and a first and second memory cell output line receiving an optical signal from the fifth and sixth optical switches respectively to provide respective complementary outputs indicating a state of the bistable element.

3. The optical content addressable memory of claim 1 further including multiple third optical switches each receiving an input determined by the output of the first optical switch and multiple fourth optical switches each receiving an input determined by the output of the second optical switch;

wherein each pair of a single third optical switch and single fourth optical switch receive first and second content input lines providing independent optical signals to different pairs denoting different search patterns;

wherein an independent content output line for each pair receives an optical signal from both of the third and fourth optical switches of the pair to provide a logical OR of those optical signals; and wherein optical switches of each pair operate at different frequencies from operating frequencies of other pairs.

4. The optical content addressable memory of claim 3 further including a frequency multiplexer receiving different search patterns to encode them in different frequencies to be simultaneously applied to the first and second content input lines allowing parallel interrogation of the bistable element according to different patterns.

5. The optical content addressable memory of claim 1 wherein the set of memory cells are arrayed in logical rows and columns with memory cells of the rows sharing a common content output line and memory cells of each column sharing common first and second content input lines independent between columns.

6. An optical content addressable memory comprising:

a set of memory cells each providing:

a first and a second optical switch each having an input and output, with the output of the first optical switch connected to the input of the second optical switch and the output of the second optical switch connected to the input of the first optical switch, each optical switch operating as an inverter to produce a bistable element;

a third and fourth optical switch each receiving an input determined by the output of the first and second optical switches respectively;

a first and second content input line providing independent optical signals to the third and fourth optical switches respectively denoting a search pattern; and a content output line receiving an optical signal from both of the third and fourth optical switches to provide a logical OR of those optical signals;

further including a fifth and sixth optical switch each receiving an input determined by an output of the first and second optical switches respectively;

a memory cell read line providing an optical signal to both of the fifth and sixth optical switches;

a first and second memory cell output line receiving an optical signal from the fifth and sixth optical switches respectively to provide respective complementary outputs indicating a state of the bistable element; and further including a seventh and eighth optical switch each providing a respective output to the inputs of the first and second optical switches;

a memory cell write line providing an optical signal to both of the seventh and eighth optical switches; and a first and second memory cell input line providing respective and mutually complementary optical signals to the inputs of the first and second optical switches to override their states.

7. The optical content addressable memory of claim 6 wherein the seventh and eighth optical switches operate at a first frequency different from a second frequency required for operation of the first and second optical switches.

8. An optical content addressable memory comprising:

a set of memory cells each providing:

a first and a second optical switch each having an input and output, with the output of the first optical switch connected to the input of the second optical switch and the output of the second optical switch connected to the input of the first optical switch, each optical switch operating as an inverter to produce a bistable element;

a third and fourth optical switch each receiving an input determined by the output of the first and second optical switches respectively;

a first and second content input line providing independent optical signals to the third and fourth optical switches respectively denoting a search pattern; and a content output line receiving an optical signal from both of the third and fourth optical switches to provide a logical OR of those optical signals;

wherein the first and second optical switches are hybrid electrical photonic devices.

9. The optical content addressable memory of claim 8 wherein the first and second optical switches are an electrical photodetector providing an optical input and producing electrical output to control a microring optical resonator providing a switched output.

10. The optical content addressable memory of claim 9 wherein the third and fourth optical switches provide an optical output as switched by a microring optical resonator receiving a tuning voltage from a photodetector and further including a semiconductor amplifier positioned between the photodetector and the microring optical resonator.

11. The optical content addressable memory of claim 10 wherein the semiconductor amplifier is selected from the group consisting of a bipolar transistor and a field effect transistor.

* * * * *